(12) United States Patent
Dang et al.

(10) Patent No.: US 10,136,530 B2
(45) Date of Patent: Nov. 20, 2018

(54) UTILITY VAULT INTERLOCKING LID SEAT

(71) Applicant: Oldcastle Precast, Inc., Auburn, WA (US)

(72) Inventors: Nguyen Thai Dang, Pomona, CA (US); Eric Long, Weston, OH (US); John Ronald Gogol, Portland, OR (US)

(73) Assignee: OLDCASTLE PRECAST, INC., Auburn, WA (US)

( * ) Notice: Subject to any disclaimer, the term of this patent is extended or adjusted under 35 U.S.C. 154(b) by 0 days.

(21) Appl. No.: 15/369,577

(22) Filed: Dec. 5, 2016

(65) Prior Publication Data

US 2017/0163018 A1    Jun. 8, 2017

Related U.S. Application Data

(60) Provisional application No. 62/262,717, filed on Dec. 3, 2015.

(51) Int. Cl.
*H05K 5/02* (2006.01)
*E02D 29/12* (2006.01)
*H02G 9/10* (2006.01)

(52) U.S. Cl.
CPC ........... *H05K 5/0208* (2013.01); *E02D 29/12* (2013.01); *H02G 9/10* (2013.01)

(58) Field of Classification Search
CPC ........ H05K 5/02–5/0208; E02D 29/12; H02G 9/10
USPC ........ 220/3.2–3.94; 174/17 R–17 CT, 18, 50
See application file for complete search history.

(56) References Cited

U.S. PATENT DOCUMENTS

| | | | |
|---|---|---|---|
| 4,567,697 A | 2/1986 | Hahne | |
| 4,863,059 A * | 9/1989 | Christensen | E02D 29/12 220/3.8 |
| 6,772,566 B1 | 8/2004 | Machledt et al. | |
| 6,899,240 B2 | 5/2005 | Dang et al. | |
| 7,163,352 B2 | 1/2007 | Jurich et al. | |
| 7,385,137 B2 | 6/2008 | Burke et al. | |
| 7,467,910 B2 | 12/2008 | Lecuyer et al. | |
| 7,748,926 B2 | 7/2010 | Jurich et al. | |
| 8,302,796 B1 * | 11/2012 | Johnson | H02G 9/10 174/66 |
| 8,835,757 B2 | 9/2014 | Freeman | |
| 9,435,099 B2 | 9/2016 | Dang | |
| 2014/0158393 A1 * | 6/2014 | Le | H05K 5/0004 174/50 |
| 2014/0197165 A1 * | 7/2014 | Korcz | H02G 3/10 220/3.9 |
| 2014/0224516 A1 * | 8/2014 | Wang | H05K 9/006 174/50 |

(Continued)

*Primary Examiner* — Kareen K Thomas
(74) *Attorney, Agent, or Firm* — Sheridan Ross PC (57) ABSTRACT

A vault system is provided that defines an enclosed volume to protect various electrical, water, communications and other components. The system comprises a lid to allow selective access to the contents in the enclosed volume of the vault. Over time, continued wear and tear on the lid of the vault can cause the lid to deflect inward and/or cause the body of the vault to deflect outward, which compromises the integrity of the vault. Interlock features, methods, and systems are provided transfer stress and strain between the lid and the vault, which maintain the integrity of the selective interconnection between the lid and the vault.

20 Claims, 10 Drawing Sheets

(56) References Cited

U.S. PATENT DOCUMENTS

2014/0311766 A1* 10/2014 Mader ................ H02B 1/46
174/50

* cited by examiner

UTILITY VAULT INTERLOCKING LID SEAT

CROSS-REFERENCE TO RELATED APPLICATIONS

This application claims priority under 35 U.S.C. § 119(e) to U.S. Provisional Patent Application Ser. No. 62/262,717 filed Dec. 3, 2015, which is incorporated herein in its entirety by reference.

FIELD OF THE INVENTION

The present invention relates generally to vaults for providing an enclosed region beneath a ground surface, and to secure and enclose underground utilizes such as electrical and communications equipment, mechanical wiring, and water fixtures. More specifically, the present invention includes interlocking features that transfer stress and strain between a lid and the wall assembly of the vault to prevent deformation and/or buckling.

BACKGROUND OF THE INVENTION

Subgrade vaults are widely used to provide internal enclosed regions where utility connections can be made and housed. Classic examples of such connections are the joiner of electrical and fiber optic cables used in street lighting, in telephone and communication systems, and water valves for residential communities and golf courses. These vaults are generally placed below grade of ground level with their upper surfaces at grade where loads from pedestrians and vehicles, as well as environmental factors such as the presence of precipitation and animals, are anticipated. Generally, the vaults will be used by municipalities, utility companies, homeowners, and other locations where longevity, durability, and affordability are important criteria.

Vault systems and devices are intended for access and interaction with trained professionals who, for example, need to service complex, dangerous, and/or valuable subgrade systems to maintain vital infrastructure. Accordingly, in addition for these devices and systems to withstand various forces and abuse due to environmental conditions, it is desirable to provide systems that allow for general ease of access to the appropriate individuals, while simultaneously preventing unauthorized access. A lid for providing access to an enclosed subgrade region must not only be structurally sound, but must be simple to remove and replace, while reliably holding the lid onto the body when access is not needed.

Subgrade storage systems generally contain and/or provide access to valuable components necessary in performing critical functions and/or with respect to monetary value. In part due to the high commodity prices of metals and other internal components, theft is an increasing problem which is not only expensive but extremely disruptive when communication, electrical or water service is discontinued. Furthermore, improperly secured or physically damaged subgrade systems may present hazardous conditions to passer-bys and professionals alike.

Prior art vaults comprise a lid or other feature to enclose a vault and protect the contents of the vault. The following references relate to the field of subgrade storage vaults and facilities and are hereby incorporated by reference in their entireties: U.S. Pat. No. 4,567,697 to Hahne; U.S. Pat. No. 6,772,566 to Machledt et al.; U.S. Pat. No. 6,899,240 to Dang et al.; U.S. Pat. No. 7,163,352 to Jurich et al.; U.S. Pat. No. 7,385,137 to Burke et al.; U.S. Pat. No. 7,467,910 to Lecuyer et al.; and U.S. Pat. No. 7,748,926 to Jurich et al.

One issue with prior art vaults is that the lid rests on a horizontal lip or seat of the vault, and thus, the lid is prone to deformation and other structural risks as weight is applied to the lid area. Subgrade vaults are often used in areas, for example sidewalks, where people walk on the lid. Since the lid rests on a horizontal lip or seat of the vault and the relative position between the lid and the horizontal lip or seat is not fixed or maintained, the center of the lid can deflect downward when a person steps on the lid or vehicles driving on the lid. In another scenario, prior art vaults are positioned in ground where shifting soils distort the shape of the side walls of the vault. Over time and repeated deflections and distortions, the lid may deform and become disengaged from the side walls of the vault and cause failure. Further, the ability of the lid to secure to the vault can become compromised, and any sensitive equipment and expensive commodities within the vault are exposed to damage or theft. Therefore, there is a long-felt but unmet need to provide a subgrade vault having features adapted to improve the structural integrity of the vault, and to provide a lid that does not become disengaged from the vault housing.

SUMMARY OF THE INVENTION

The above needs and other needs are addressed by the various embodiments and configurations of the present invention. This invention relates to interlock features in a lid and a vault that maintain the relative position between the lid and the vault, which prevents any substantial deflection of the lid and disengagement of the lid from the side walls of the vault. More specifically, the interlock features transfer a stress and strain between the lid and the vault such that the lid and the vault absorb the stress and strain as a single structure.

It is one aspect of embodiments of the present invention to provide an interlock feature on a lid and complimentary interlock feature on an associated vault. The interlock features maintain the relative position of the lid and the vault. In some embodiments, this means that the interlock features engage and prevent relative movement between the lid and the vault in response to a force normal to a top surface of the lid such as a pedestrian or vehicle traveling over the lid. In these embodiments, when a force is applied on the lid, the lid does not deflect as much and transfers at least some of the stress and strain to the vault through the combined interlock features. The interlock features may come in a variety of configurations. In some embodiments, the interlock features are a channel and a corresponding protrusion. In other embodiments, for example, the interlock features are an aperture and a locking element. It will be appreciated by one skilled in the art that other geometric configurations and combinations of interlock features may be used to interconnect the lid to the vault side walls and to maintain the relative position of the lid and the vault.

It is another aspect of embodiments of the present invention to provide an interlock feature that comprises a fastener channel and/or an orientation channel. As noted above, in some embodiments, the interlock features are a channel and protrusion configuration. The channel may be positioned in a seat of the vault and the protrusion may be positioned in the lid, or vice versa. A fastener channel forms an angle with a center point or central axis of the lid. In various embodiments, this fastener channel angle is between approximately 10 and 170 degrees such that an axis of the fastener channel does not intersect the center point or central axis of the lid.

This configuration allows the lid to transfer stress and strain to the combined interlock features, which in turn transfer stress and strain to the vault.

One embodiment of the present invention is an interlock feature that comprises an orientation channel. A longitudinal axis of the orientation channel may intersect with the center point of the central axis of the lid. The orientation channel can help align the lid with the vault as the interlock features are combined. In addition, the orientation channel may also transfer torsional or twisting forces between the lid and the vault. It will be appreciated that fastener channels and orientation channels may be used in a variety of configurations. For example, an interlock feature may comprise a fastener channel and an orientation channel that are positioned at a right angle to each other. In other embodiments, an interlock feature may comprise more than one fastener channel or more than one orientation channel.

It is another aspect of the present invention to provide a plurality of interlock features and combinations of interlock features. A single interlock combination between the lid and the vault may be provided in some embodiments, but a plurality of interlock combinations may be utilized to more evenly distribute the transfer of forces between the lid and the vault. Further, a locking mechanism that secures the lid to the vault may pass through the combined interlock features in some embodiments.

In various embodiments, the present invention comprises a lid adapted to be selectively interconnected to a vault structure. In one embodiment, a lid of the present invention comprises a thermoplastic plastic material to accommodate stress concentrations at specific locations and generally prevent or reduce the risk of chipping and cracking at corner and perimeter regions of the lid. The vault may also comprise a thermoplastic material. It will be further appreciated that the lid and vault may comprise other materials, for example, precast concrete.

In one embodiment, the present invention comprises a subgrade vault having a lid with a single aperture formed in a corner of the lid and corresponding aperture formed in the vault sidewall for receiving a locking mechanism. In an alternative embodiment, the present invention comprises a lid having a plurality of apertures in a plurality of corners of the lid, each of the apertures corresponding to a subgrade locking mechanism for securing the lid to the vault.

In various embodiments, the present invention comprises a lid with one or more apertures and corresponding subgrade locking mechanism(s) disposed in a central region of the lid and vault opening. For example, in a particular embodiment, the present invention comprises a lid with an aperture disposed in a central region of the lid and a locking mechanism spanning across a dimension of the vault and providing a point of attachment for the lid within a central region of the lid, or alternatively on one or more edges of the vault.

In various embodiments, the present invention comprises a lid having one or more apertures with removable features for selectively viewing or accessing a subgrade feature, such as a meter. For example, in one embodiment, a lid is provided having a removable feature adapted for being selectively removed from a portion of the lid such that subgrade features, such as a water meter, may be read without the need for complete removal of the lid. The removable feature may snap of screw onto the lid to cover the aperture in the lid. In various embodiments, the removable feature or features comprise pry-off lids adapted to be removed and applied with relative ease to observe or read one or more subgrade features. In alternative embodiments, lids for observing subgrade features comprise securing features, such as tamper-proof fasteners as previously described.

In various embodiments, subgrade vault lids are provided having one more plates or portions adapted to display information. For example, in one embodiment, a composite plastic and concrete cover is provided having a plastic name plate for displaying general information related to the contents of the vault (e.g. "ELECTRICAL," "WATER," "GAS," etc.).

In some embodiments, locking assemblies may be used to secure a lid to a vault. Examples of these locking assemblies may be found in U.S. Pat. Nos. 8,835,757 and 9,435,099, which are hereby incorporated by reference in their entireties. It is also an aspect of embodiments of the present invention to utilize locking assemblies such as Oldcastle Carson's Drop-N-Lock Automatic Security System, without using bolts.

One particular embodiment is a utility vault with an interlocking a vault and lid, comprising a vault having a plurality of side walls with an upper end that defines an opening, the vault having a seat positioned proximate to the upper end; a first interlock feature positioned within the seat of the vault, the first interlock feature having a fastener channel; a lid configured to selectively interconnect to the seat of the vault to close the opening defined by the upper end of the plurality of side walls; and a second interlock feature positioned on the lid, wherein the second interlock feature operably engages the first interlock feature when the lid is selectively interconnected to the seat of the vault, wherein the engaged interlock features maintain a relative position between the vault and lid.

In some embodiments, the seat of the vault is positioned a predetermined distance from the upper end of the plurality of side walls to promote a ledge for supporting a lower portion of the lid. In various embodiments, a fastener axis is oriented between a center of the vault and a center of the fastener channel, and a longitudinal axis of the fastener channel forms a fastener angle with the fastener axis, the fastener angle is between approximately 60 degrees and 120 degrees. In some embodiments, the second interlock feature comprises a protrusion that extends into the fastener channel of the first interlock feature to operably engage the interlock features.

In various embodiments, the first interlock feature comprises an orientation channel that extends to an inner surface of the vault, and wherein the orientation channel is oriented substantially perpendicular to the fastener channel. In some embodiments, a longitudinal axis of the orientation channel intersects a center of the vault. In various embodiments, the first interlock feature comprises a circular recess, and the second interlock feature comprises a protrusion that extends into the circular recess in the first interlock feature to operably engage the interlock features and to maintain the relative position between the lid and the vault.

In some embodiments, the vault further comprises a third interlock feature positioned within the seat of the vault; and a fourth interlock feature positioned on the lid, wherein the fourth interlock feature operably engages with the third interlock feature when the lid is selectively interconnected to the seat of the vault. In various embodiments, a longitudinal axis of the fastener channel does not intersect a center of the vault. In some embodiments, the vault further comprises an aperture positioned in the lid; and a locking element for selectively interconnecting the lid to the seat of the vault, the locking element sized for positioning within the aperture in the lid.

In various embodiments, the vault further comprises a plurality of first interlock features positioned within the seat of the vault; and a plurality of second interlock features positioned on the lid, wherein the plurality of second interlock features operably engages the plurality of first interlock features when the lid is selectively interconnected to the seat of the vault.

Another particular embodiment of the present invention is a method of maintaining a relative position of an enclosure and a lid, comprising (i) providing an enclosure having a plurality of side walls with an upper end that defines an opening, and a first interlock feature positioned within at least two side walls of the plurality of side walls and proximate to the upper end; (ii) providing a fastener channel of the first interlock feature; (iii) providing a lid having a second interlock feature, the second interlock feature having a protrusion; and (iv) selectively interconnecting the lid to the enclosure and positioning the protrusion of the second interlock feature in the fastener channel of the first interlock feature to maintain a relative position of the enclosure and the lid.

In some embodiments, a fastener axis is oriented between a center of the enclosure and a center of the fastener channel, and a longitudinal axis of the fastener channel forms a fastener angle with the fastener axis, the fastener angle is between approximately 60 degrees and 120 degrees. In various embodiments, the method further comprises (v) providing an orientation channel of the first interlock feature, wherein an orientation axis is oriented between a center of the enclosure and a center of the orientation channel, and a longitudinal axis of the orientation channel forms an orientation angle with the orientation axis, the orientation angle is between approximately −30 degrees and 30 degrees; and (vi) positioning the protrusion of the second interlock feature in the orientation channel of the first interlock feature. In some embodiments, the fastener channel and the orientation channel are oriented at substantially perpendicular angles to each other.

In various embodiments, the method further comprises (vii) providing a plurality of first interlock features within a shoulder of the upper end of the side walls; and (viii) providing a plurality of second interlock features on the lid, wherein the second interlock features are positioned on the lid to selectively interconnect to the plurality of first interlock features. In some embodiments, a fastening means extends through an aperture of the first interlock feature and an aperture of the second interlock feature to secure the lid to the enclosure.

Yet another particular embodiment of the present invention is a subgrade utility vault defining an enclosed volume, comprising a plurality of side walls having an upper end that defines an opening; a shoulder positioned on an inner surface of the plurality of side walls, wherein an area defined by an inner perimeter of the shoulder is less than an area defined by the opening; a plurality of first interlock features positioned within the shoulder, each first interlock feature comprises a fastener channel and an orientation channel that are oriented substantially perpendicular to each other; wherein a fastener axis is oriented between a center of the vault and a center of the fastener channel, and a longitudinal axis of the fastener channel forms a fastener angle with the fastener axis, the fastener angle is between approximately 60 degrees and 120 degrees; wherein an orientation axis is oriented between the center of the vault and a center of the orientation channel, and a longitudinal axis of the orientation channel forms an orientation angle with the orientation axis, the orientation angle is between approximately −30 degrees and 30 degrees; and wherein the fastener channel and the orientation channel of each first interlock feature are configured to receive a protrusion from a second interlock feature of a lid.

In some embodiments, at least one of the first interlock features and comprises an aperture than is configured to receive a locking mechanism that passes through an aperture of the corresponding second interlock feature of the lid. In various embodiments, the vault further comprises a third interlock feature positioned within the shoulder, the third interlock feature having a fastener channel, wherein a third axis is oriented between the center of the vault and a center of the fastener channel of the third interlock feature, and a longitudinal axis of the fastener channel of the third interlock feature forms a third angle with the third axis, the third angle is between approximately 60 degrees and 120 degrees, wherein the third angle of the third interlock feature is distinct from the fastener angle of the first interlock features.

The Summary of the Invention is neither intended nor should it be construed as being representative of the full extent and scope of the present invention. The present invention is set forth in various levels of detail in the Summary of the Invention as well as in the attached drawings and the Detailed Description of the Invention and no limitation as to the scope of the present invention is intended by either the inclusion or non-inclusion of elements or components. Additional aspects of the present invention will become more readily apparent from the Detailed Description, particularly when taken together with the drawings.

The above-described embodiments, objectives, and configurations are neither complete nor exhaustive. As will be appreciated, other embodiments of the invention are possible using, alone or in combination, one or more of the features set forth above or described in detail below.

The phrases "at least one," "one or more," and "and/or," as used herein, are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B, and C together.

Unless otherwise indicated, all numbers expressing quantities, dimensions, conditions, and so forth used in the specification and claims are to be understood as being modified in all instances by the term "about."

The term "a" or "an" entity, as used herein, refers to one or more of that entity. As such, the terms "a" (or "an"), "one or more," and "at least one" can be used interchangeably herein.

The use of "including," "comprising," or "having" and variations thereof herein is meant to encompass the items listed thereafter and equivalents thereof as well as additional items. Accordingly, the terms "including," "comprising," or "having" and variations thereof can be used interchangeably herein.

It shall be understood that the term "means" as used herein shall be given its broadest possible interpretation in accordance with 35 U.S.C. § 112(f). Accordingly, a claim incorporating the term "means" shall cover all structures, materials, or acts set forth herein, and all of the equivalents thereof. Further, the structures, materials, or acts and the equivalents thereof shall include all those described in the summary of the invention, brief description of the drawings, detailed description, abstract, and claims themselves.

BRIEF DESCRIPTION OF THE DRAWINGS

The accompanying drawings, which are incorporated in and constitute a part of the specification, illustrate embodiments of the invention and together with the Summary of the Invention given above and the Detailed Description of the drawings given below, serve to explain the principles of these embodiments. In certain instances, details that are not necessary for an understanding of the invention or that render other details difficult to perceive may have been omitted. It should be understood, of course, that the invention is not necessarily limited to the particular embodiments illustrated herein. Additionally, it should be understood that the drawings are not necessarily to scale.

Similar components and/or features may have the same reference label. Further, various components of the same type may be distinguished by following the reference label by a letter that distinguishes among the similar components. If only the first reference label is used, the description is applicable to any one of the similar components having the same first reference label irrespective of the second reference label.

A list of the various components shown in the drawings and associated numbering is provided herein:

| Number | Component |
| --- | --- |
| 2 | Vault |
| 4 | Lid |
| 6 | Collar |
| 8 | Force |
| 10 | Gap |
| 12 | Body |
| 14 | Seat |
| 16 | Locking Mechanism |
| 18 | Aperture |
| 20a | First Interlock Feature |
| 20b | Second Interlock Feature |
| 22 | Fastener Channel |
| 24 | Orientation Channel |
| 26 | Fastener Axis |
| 28 | Body Center |
| 30 | Center Axis |
| 32 | Fastener Angle |
| 34 | Body Height |
| 36 | Seat Distance |
| 38 | Bottom Inset Height |
| 40 | Body Length |
| 42 | Collar Length |
| 44 | Seat Length |
| 46 | Inset Outer Length |
| 48 | Inset Inner Length |
| 50 | Body Width |
| 52 | Collar Width |
| 54 | Seat Width |
| 56 | Inset Outer Width |
| 58 | Inset Inner Width |
| 60 | Wall Thickness |
| 62 | Lid Length |
| 64 | Aperture Length Spacing |
| 66 | Lid Width |
| 68 | Aperture Width Spacing |
| 70 | Lid Radius |
| 72 | Lattice Upper Length |
| 74 | Lattice Lower Length |
| 76 | Rib Height |
| 78 | Lattice Height |
| 80 | Face Thickness |
| 82 | Rib Thickness |
| 84 | Lattice Upper Width |
| 86 | Lattice Lower Width |

DETAILED DESCRIPTION

The present invention has significant benefits across a broad spectrum of endeavors. It is the Applicant's intent that this specification and the claims appended hereto be accorded a breadth in keeping with the scope and spirit of the invention being disclosed despite what might appear to be limiting language imposed by the requirements of referring to the specific examples disclosed. To acquaint persons skilled in the pertinent arts most closely related to the present invention, a preferred embodiment that illustrates the best mode now contemplated for putting the invention into practice is described herein by, and with reference to, the annexed drawings that form a part of the specification. The exemplary embodiment is described in detail without attempting to describe all of the various forms and modifications in which the invention might be embodied. As such, the embodiments described herein are illustrative, and as will become apparent to those skilled in the arts, may be modified in numerous ways within the scope and spirit of the invention.

Although the following text sets forth a detailed description of numerous different embodiments, it should be understood that the detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims. To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning.

Various embodiments of the present invention are described herein and as depicted in the drawings. It is expressly understood that although the figures depict lids, vaults, and interlock features, and methods and systems for using the same, the present invention is not limited to these embodiments. Further, some terms may be used interchangeably, for example, "subgrade utility vault," "utility vault," and "vault" may be used interchangeably.

Figure 1A:
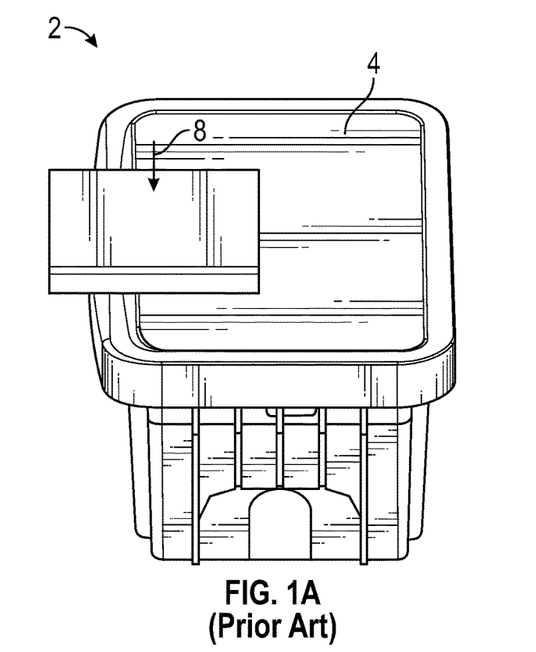
FIG. 1A is a front perspective view of a prior art subgrade utility vault with a force applied to the vault and a lid.
Figure 1B:
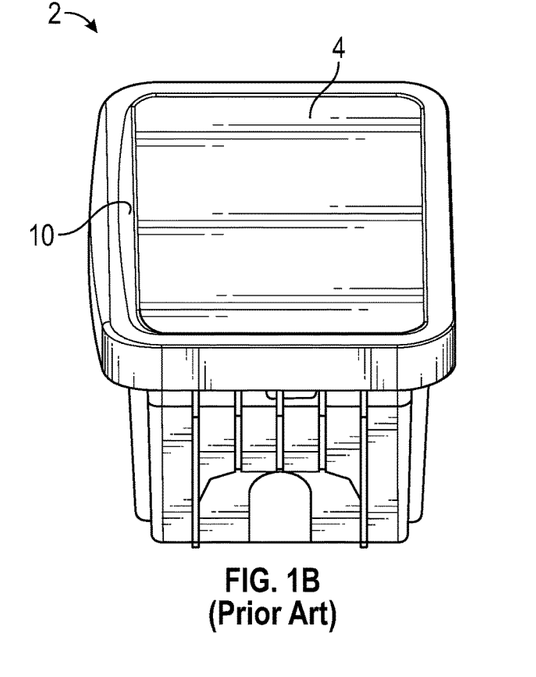
FIG. 1B is a front perspective view of a prior art subgrade utility vault with a gap formed between the vault and the lid.

Referring to FIGS. 1A and 1B, perspective views of a prior art subgrade utility vault 2 are provided. The prior art lid 4 rests on a horizontal lip of the vault 2, and the lid 4 can be secured to the vault 2 using a screw, padlock, etc. However, the lid 4 is not further secured or interlocked to the lip of the vault 2, which allows for relative movement between the lid 4 and the vault 2. In FIG. 1A, a force 8 normal to the top surface of the lid 4 is applied to the vault system. When a force 8 is applied on the lid 4 and/or the vault 2, the lid 4 and the vault 2 move relative to each other due to a deflection of the lid 4 and/or a deflection of the vault 2. These movements and deflections result in the gap 10 shown in FIG. 1B, which compromises the integrity of the prior art vault system and can cause the lid 4 to disengage from the vault 2.

Figure 2A:
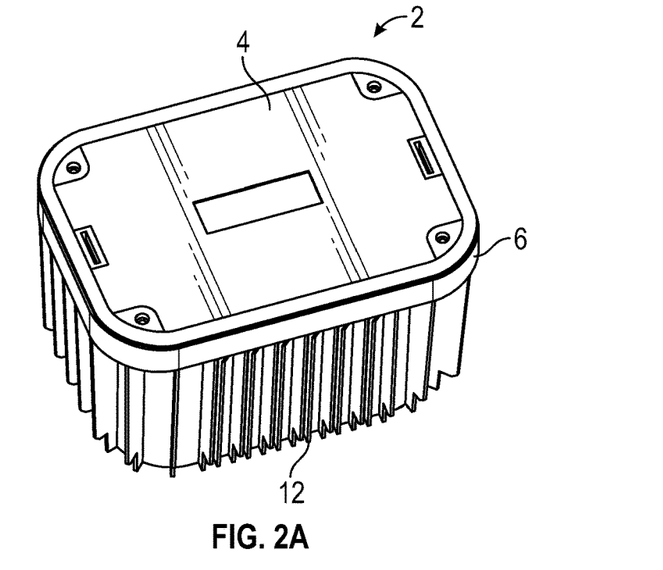
FIG. 2A is a front perspective view of a utility vault and a lid in accordance with various embodiments of the present invention.
Figure 2B:
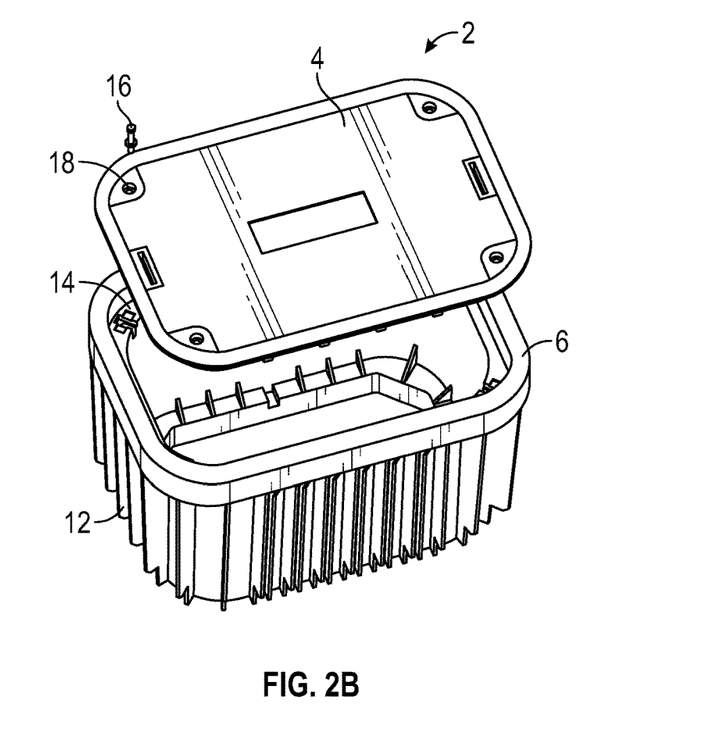
FIG. 2B is a perspective view of a utility vault and a lid elevated from the vault in accordance with various embodiments of the present invention.

Now referring to FIGS. 2A and 2B, perspective views of a utility vault 2 according to embodiments of the present invention are provided. The vault 2 has a body 12, which in this embodiment is comprised of four walls configured in a rectangular shape. A lid 4 is selectively interconnected to a collar 6 positioned on the upper end of the body 12 of the vault 2. In some embodiments, the collar 6 is comprised of a separate material than the vault 2, and in other embodiments the collar 6 is the upper end portion of the vault 2. The lid 4 rests on a seat 14 of the collar 6, and the seat 14 is generally oriented perpendicular to the body 12 of the vault 2.

A locking mechanism 16 can selectively interconnect the lid 4 to the vault 2. The lid 4 in FIG. 2B comprises four apertures 18, one aperture 18 in each corner of the rectangular lid 4. The locking mechanism 16 in this embodiment is a screw that passes through an aperture 18 and into the vault 2 to selectively interconnect the lid 4 to the vault 2. Interlock features described in further detail below transfer stress and strain between the lid 4 and the vault 2 and maintain the relative positioning of the lid 4 and the vault 2 so that little or no gaps 10 form and the structural integrity of the overall vault system is preserved.

Figure 3A:
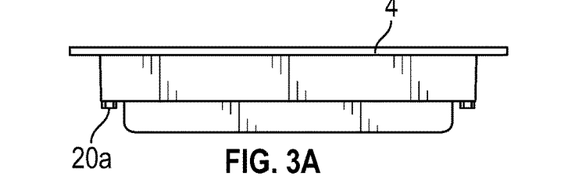
FIG. 3A is a side elevation view of a lid with a first interlock feature in accordance with various embodiments of the present invention.
Figure 3B:
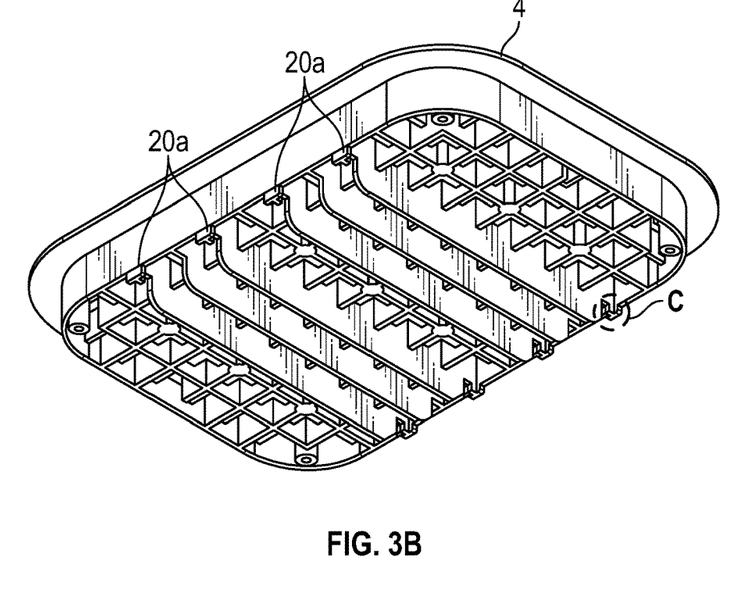
FIG. 3B is a bottom perspective view of a lid with a plurality of first interlock features in accordance with various embodiments of the present invention.
Figure 3C:
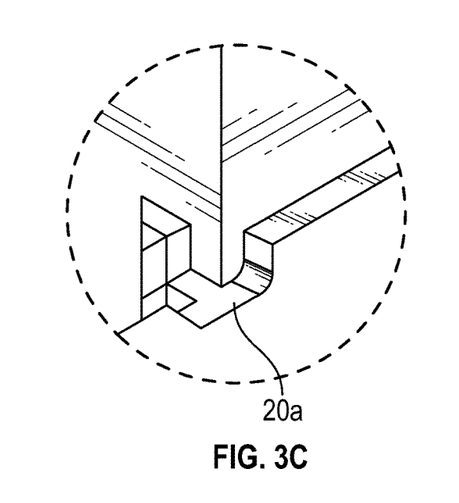
FIG. 3C is a detailed, exploded view of area "C" in FIG. 3B that details the protrusion that corresponds to channels described herein, in accordance with various embodiments of the present invention.

Now referring to FIGS. 3A-3C, various views of a lid 4 having a first interlock feature 20a are provided. FIG. 3A is a side elevation view of the lid 4, FIG. 3B is a perspective view of the lid 4, and FIG. 3C is a detailed view of the first interlock feature 20a. As shown in FIG. 3A, the first interlock feature 20a is a protrusion that extends below a portion of the lid 4. As shown in FIG. 3B, a plurality of interlock features 20a are arrayed along a first side and a second side of the lid 4. Additional interlock features 20a can distribute the stress and strain transferred between the lid 4 and the vault. FIG. 3B also depicts an area "C". FIG. 3C is a detailed view of area "C" from FIG. 3B, and the first interlock feature 20a is "T" shaped. A second interlock feature, described in further detail below, can be a channel with a corresponding "T" shape, which is configured to receive the first interlock feature 20a. One length of the first interlock feature 20a (the top of the "T") transfers stress and strain between the lid 4 and the vault when a force normal to the top surface of the lid 4 is applied to the vault system, and another length of the first interlock feature 20a (the other portion of the "T") transfers stress and strain between the lid 4 and the vault when a torsional or twisting force is applied to the vault system.

Figure 4A:
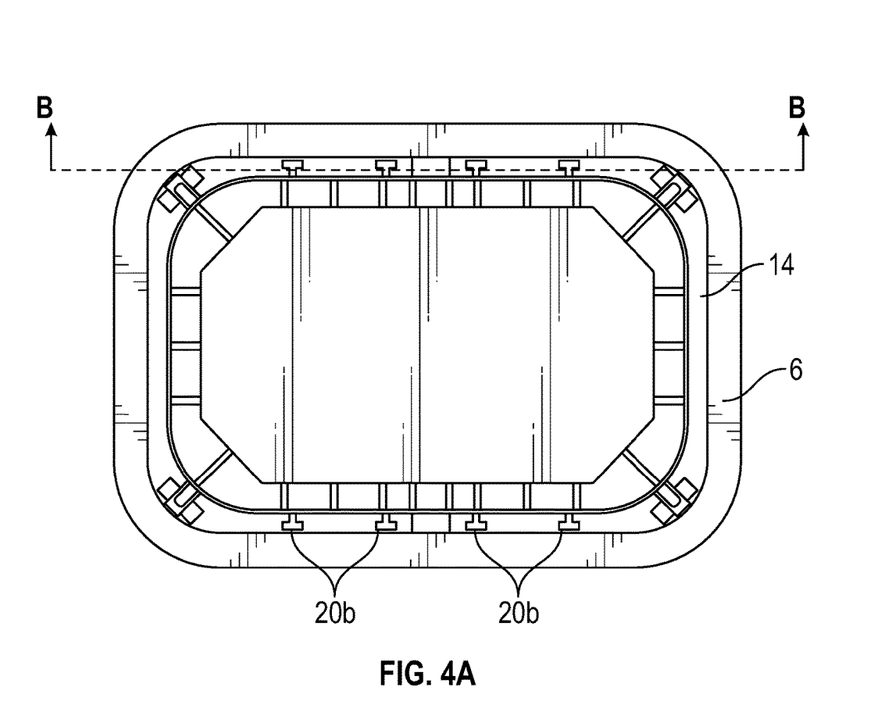
FIG. 4A is a top plan view of a vault having a plurality of second interlock features in accordance with various embodiments of the present invention.
Figure 4B:
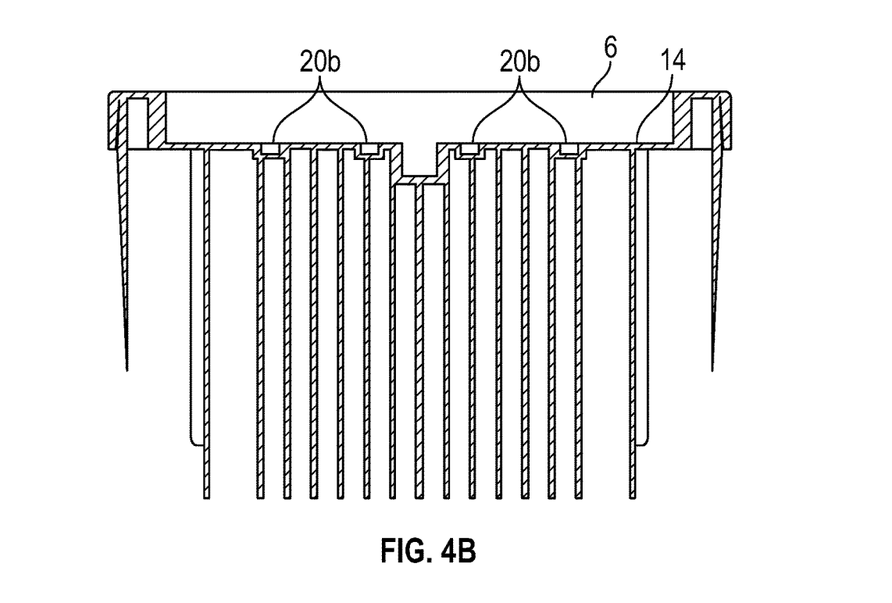
FIG. 4B is a cross-sectional view of a vault taken along line B-B in FIG. 4A in accordance with various embodiments of the present invention.

Now referring to FIGS. 4A and 4B, various views of a second interlock feature 20b in the collar 6 of the vault are provided. FIG. 4A is a top plan view of the vault showing various second interlock features 20b arrayed in a seat 14 of the collar 6. A line B-B is also shown in FIG. 4A. Now referring to FIG. 4B, a cross-sectional view of the vault taken along line B-B is provided. The second interlock features 20b are recesses that extend downward from the seat 14 of the collar 6. It will be appreciated that the interlock features 20a, 20b may comprise any material, including materials that are distinct from the vault 2 and the lid 4. For example, the interlock features 20a, 20b may be steel inserts that are integrated into plastic components. Or in a further example, the interlock features 20a, 20b may be steel inserts that are welded to other metal components. Finally, the interlock features 20a, 20b may be a continuous, plastic portion of the other components of the vault system.

Figure 5A:
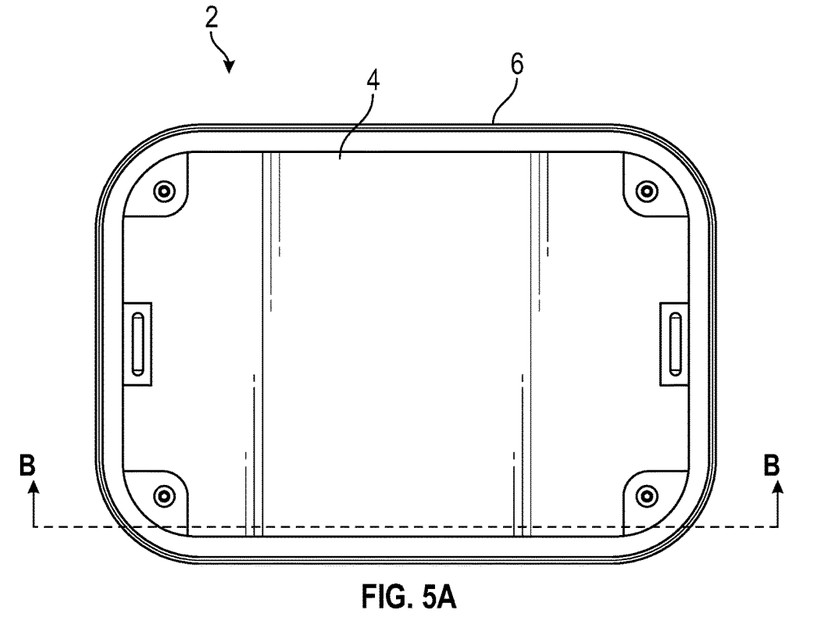
FIG. 5A is a top plan view of a combined vault and lid in accordance with various embodiments of the present invention.
Figure 5B:
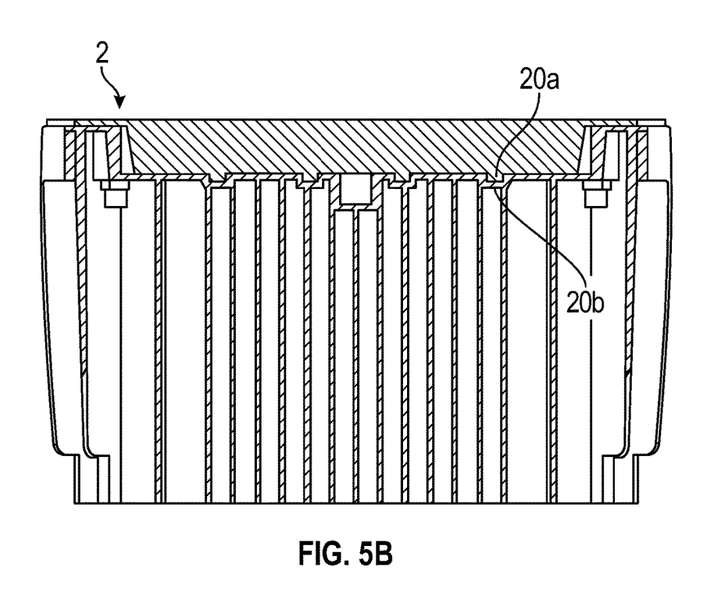
FIG. 5B is a cross-sectional view of a combined vault and lid taken along line B-B in FIG. 5A in accordance with various embodiments of the present invention.

Now referring to FIGS. 5A and 5B, various views of a combined vault 2 and lid 4 are provided. FIG. 5A is a top plan view of the vault 2 and the lid 4, and line B-B is shown along one side of the vault 2. FIG. 5B is a cross-sectional view of the vault 2 and the lid 4 taken along line B-B. This cross-sectional view shows the first interlock feature 20a of the lid 4 extending into the second interlock feature 20b of the vault 2 to maintain the relative position of the lid 4 and the vault 2 and to transfer stress and strain between the lid 4 and the vault 2.

Figure 6A:
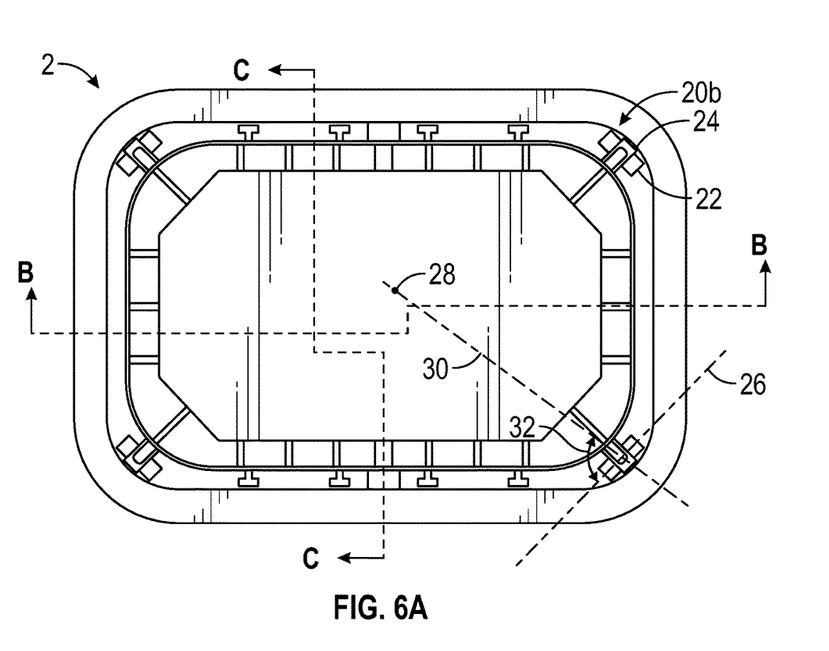
FIG. 6A is a top plan view of a vault with a plurality of second interlock features in accordance with various embodiments of the present invention.

Now referring to FIGS. 6A-6E, various views of the vault 2 are provided. FIG. 6A is a top plan view of the vault 2. A second interlock feature 20b is depicted where the second interlock feature 20b comprises a fastener channel 22 and an orientation channel 24. These channels 22, 24 are substantially perpendicular to each other and provide different functions. The fastener channel 22 maintains the relative positioning between the vault 2 and the lid 4 when, for example, a normal force on the lid 4 deflects the lid 4 downwards. The orientation channel 24 maintains the relative positioning between the vault 2 and the lid 4 when, for example, a twisting or torsional force is applied to one or both of the vault 2 and the lid 4. Both channels 22, 24 help locate the lid 4 relative to the vault 2 when the lid 4 is selectively interconnected to the vault 2.

With the top plan view of FIG. 6A, the channels 22, 24 can be described with reference to a center 28 of the vault 2 and a reference axis 30 extending from the center 28 of the vault 2 to a center of the interlock feature 20b. It will be appreciated that the term "center" could refer to the center of the area covered by the vault 2 or feature when viewed in a top plan view. In some embodiments, if the vault has a square shape, then the fastener channel 22 can be perpendicular to the reference axis 30, and the orientation channel 24 can be aligned with the reference axis 30. In the depicted embodiment, the vault 2 has a rectangular shape, and the channels 22, 24 are not aligned with the reference axis 30. Thus, a fastener axis 26 may form a fastener angle 32 with the reference axis 30, and the fastener 32 may be an angle other than 90 degrees, i.e., other than perpendicular. In FIG. 6A, the fastener angle is approximately 80 degrees. Similarly, an orientation axis of the orientation channel 24 may form an orientation angle with the reference axis 30, and in FIG. 6A, the orientation angle is approximately 10 degrees.

In some embodiments, the fastener angle 32 ranges between approximately 10 degrees and 170 degrees. Similarly, in some embodiments, the orientation angel is between approximately 80 degrees and −80 degrees. It should be appreciated that in other embodiments, the orientation channel 24 and the fastener channel 22 may form any number of angles. The channels 22, 24 in this top plan view are straight and linear. However, it will be appreciated that the channels 22, 24 can have other shapes. For instance, the channels 22, 24 may have a circular shape or a spline shape that is defined by an n-order polynomial. Further, when viewed from a side elevation perspective, the channels 22, 24 may have varying shapes. Lastly, lines B-B and C-C are shown in FIG. 6A for discussion in FIGS. 6B and 6C, respectively.

Figure 6B:
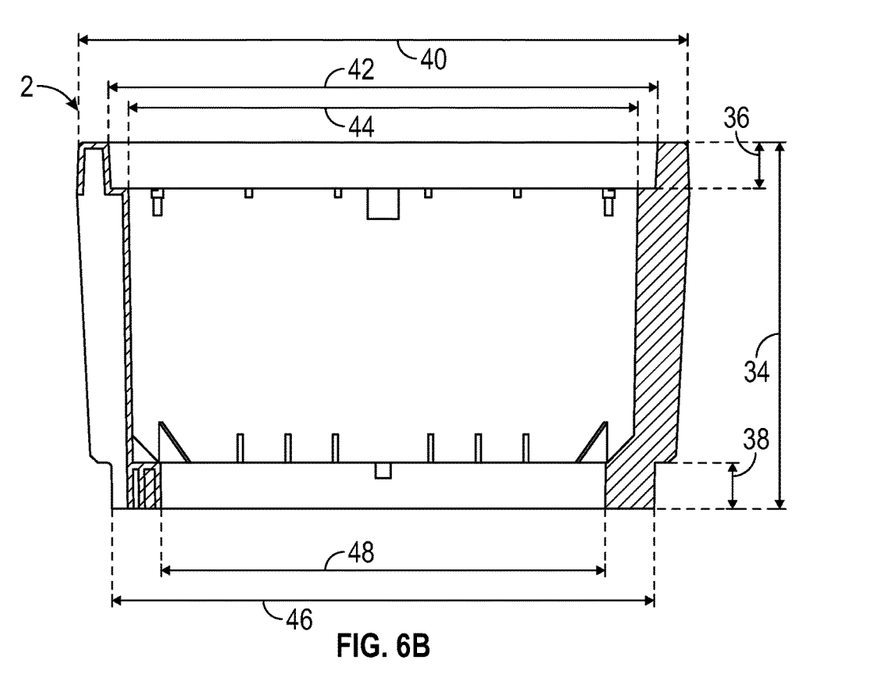
FIG. 6B is a cross-sectional view of a vault taken along line B-B in FIG. 6A in accordance with various embodiments of the present invention.

Now referring to FIG. 6B, a cross-sectional view of the vault 2 taken along line B-B is provided. While not intending to be limiting, several dimensions of the vault 2 are provided to aid one skilled in the art to better understand the present invention. In other words, the various components of the present invention may come in any size and shape, but the dimensions described in detail below are exemplary in nature. In some embodiments, the body height 34 is between approximately 20 and 28 inches. In various embodiments, the body height 34 is between approximately 22 and 26 inches. In certain embodiments, the body height 34 is approximately 24 inches. In some embodiments, the seat distance 36 is between approximately 1 and 5 inches. In various embodiments, the seat distance 36 is between approximately 2 and 4 inches. In certain embodiments, the seat distance 36 is approximately 3 inches. In some embodiments, the bottom inset height 38 is between approximately 1 and 5 inches. In various embodiments, the bottom inset height 38 is between approximately 2 and 4 inches. In certain embodiments, the bottom inset height 38 is approximately 3 inches.

In some embodiments, the body length 40 is between approximately 32 and 48 inches. In various embodiments, the body length 40 is between approximately 36 and 44 inches. In certain embodiments, the body length 40 is approximately $39^{15}/_{16}$ inches. In some embodiments, the collar length 42 is between approximately 31 and 40 inches. In various embodiments, the collar length 42 is between approximately 34 and 37 inches. In certain embodiments, the collar length 42 is approximately $35\frac{7}{8}$ inches. In some embodiments, the seat length 44 is between approximately 30 and 37 inches. In various embodiments, the seat length 44 is between approximately 32 and 35 inches. In certain embodiments, the seat length 44 is approximately $33\frac{1}{2}$ inches.

In some embodiments, the inset outer length 46 is between approximately 31 and 40 inches. In various embodiments, the inset outer length 46 is between approximately 34 and 37 inches. In certain embodiments, the inset outer length 46 is approximately $35\frac{1}{2}$ inches. In some embodiments, the inset inner length 48 is between approximately 26 and 34 inches. In various embodiments, the inset inner length 48 is between approximately 28 and 32 inches. In certain embodiments, the inset inner length 48 is approximately $29\frac{1}{8}$ inches.

Figure 6C:
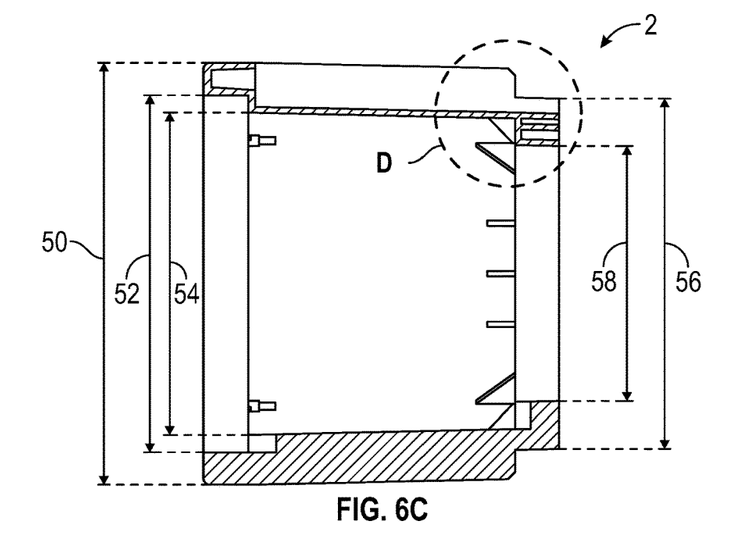
FIG. 6C is a cross-sectional view of a vault taken along line C-C in FIG. 6A in accordance with various embodiments of the present invention.

Now referring to FIG. 6C, a cross-sectional view of the vault 2 taken along line C-C is provided. Similar to FIG. 6B, various dimensions are provided to aid one skilled in the art to further understand the present invention. Detailed area "D" is also provided in FIG. 6C. In some embodiments, the body width 50 is between approximately 22 and 34 inches. In various embodiments, the body width 50 is between approximately 26 and 30 inches. In certain embodiments, the body width 50 is approximately $28\frac{5}{16}$ inches. In some embodiments, the collar width 52 is between approximately 20 and 28 inches. In various embodiments, the collar width 52 is between approximately 22 and 26 inches. In certain embodiments, the collar width 52 is approximately $24\frac{1}{4}$ inches. In some embodiments, the seat width 54 is between approximately 16 and 28 inches. In various embodiments, the seat width 54 is between approximately 18 and 26 inches. In certain embodiments, the seat width 54 is approximately $21\frac{7}{8}$ inches.

In some embodiments, the inset outer width 56 is between approximately 18 and 30 inches. In various embodiments, the inset outer width 56 is between approximately 20 and 28 inches. In certain embodiments, the inset outer width 56 is approximately $23\frac{7}{8}$ inches. In some embodiments, the inset inner width 58 is between approximately 12 and 24 inches. In various embodiments, the inset inner width 58 is between approximately 16 and 20 inches. In certain embodiments, the inset inner width 58 is approximately $17\frac{1}{2}$ inches.

Figure 6D:
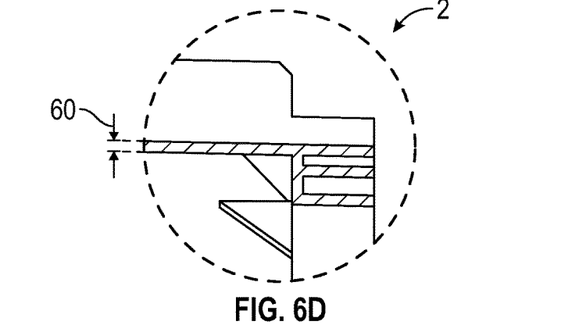
FIG. 6D is a detailed view of area "D" in FIG. 6C in accordance with various embodiments of the present invention.

Now referring to FIG. 6D, a detailed view of area "D" from FIG. 6C is provided. Various dimensions are provided to aid one skilled in the art to further understand the present invention. In some embodiments, the wall thickness 60 is between approximately $\frac{1}{8}$ and $\frac{5}{8}$ inches. In various embodiments, the wall thickness 60 is between approximately $\frac{1}{4}$ and $\frac{1}{2}$ inches. In certain embodiments, the wall thickness 60 is approximately $\frac{3}{8}$ inches.

Figure 6E:
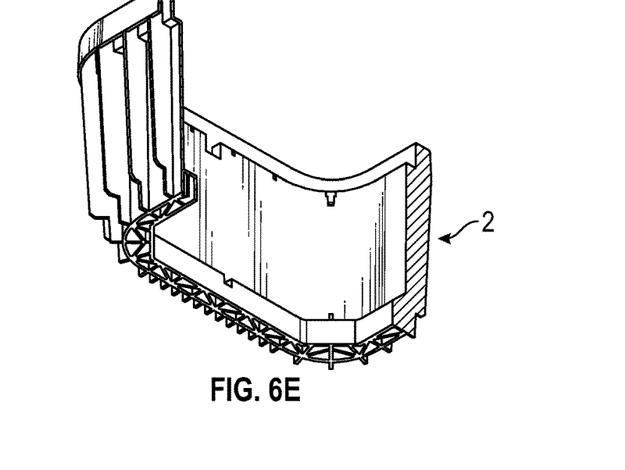
FIG. 6E is a perspective, cross-sectional view of a vault in accordance with various embodiments of the present invention.

Now referring to FIG. 6E, a perspective view of the vault 2 is provided to illustrate additional aspects of the present invention.

Figure 7A:
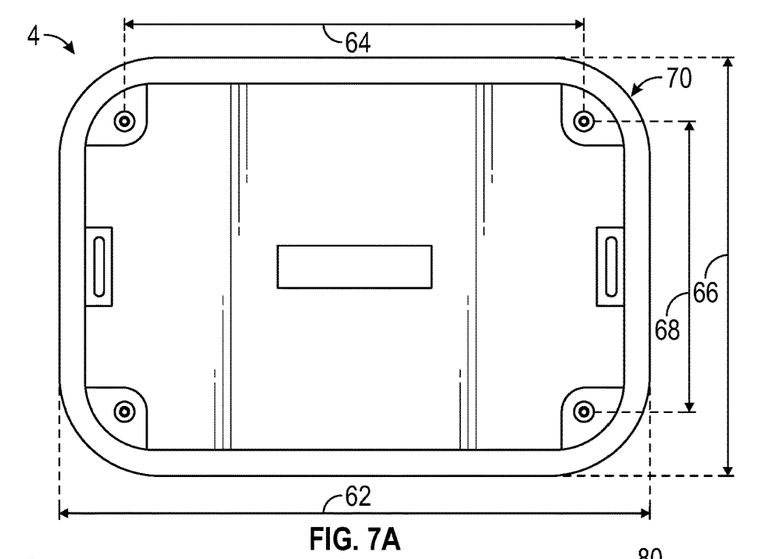
FIG. 7A is a top plan view of a lid in accordance with various embodiments of the present invention.
Figure 7B:
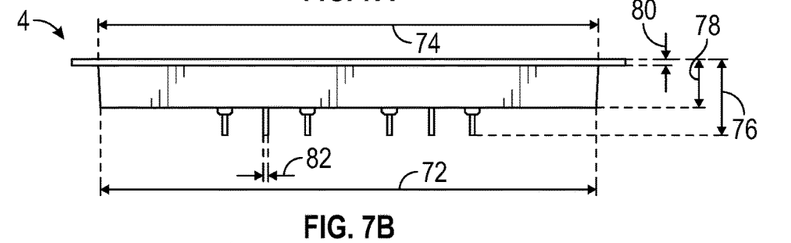
FIG. 7B is a front elevation view of a lid in accordance with various embodiments of the present invention.
Figure 7C:
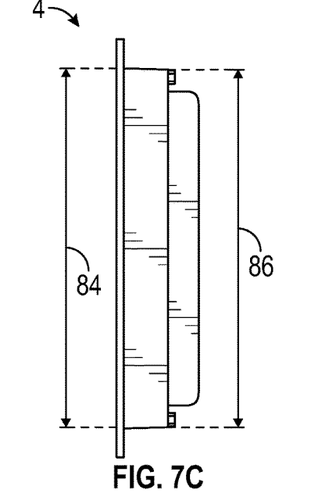
FIG. 7C is a side elevation view of a lid in accordance with various embodiments of the present invention.

Now referring to FIGS. 7A-7C, various views of the lid 4 are provided. FIG. 7A is a top plan view of the lid 4, and various exemplary dimensions are provided. In some embodiments, the lid length 62 is between approximately 32 and 48 inches. In various embodiments, the lid length 62 is between approximately 36 and 44 inches. In certain embodiments, the lid length 62 is approximately $39\frac{3}{8}$ inches. In some embodiments, the aperture length spacing 64 is between approximately 23 and 39 inches. In various embodiments, the aperture length spacing 64 is between approximately 27 and 35 inches. In certain embodiments, the aperture length spacing 64 is approximately $31\frac{1}{8}$ inches.

In some embodiments, the lid width 66 is between approximately 20 and 36 inches. In various embodiments, the lid width 66 is between approximately 24 and 32 inches. In certain embodiments, the lid width 66 is approximately 27¾ inches. In some embodiments, the aperture width spacing 68 is between approximately 12 and 28 inches. In various embodiments, the aperture width spacing 68 is between approximately 16 and 24 inches. In certain embodiments, the aperture width spacing 68 is approximately 19½ inches.

In some embodiments, the lid radius 70 is between approximately 2 and 12 inches. In some embodiments, the lid radius 70 is between approximately 4 and 8 inches. In certain embodiments, the lid radius 70 is approximately 6⅞ inches.

Now referring to FIG. 7B, a front elevation view of the lid 4 and various exemplary dimensions thereof are provided. In some embodiments, the lattice upper length 72 is between approximately 27 and 43 inches. In various embodiments, the lattice upper length 72 is between approximately 31 and 39 inches. In certain embodiments, the lattice upper length 72 is approximately 35⁵⁄₁₆ inches. In some embodiments, the lattice lower length 74 is between approximately 27 and 43 inches. In various embodiments, the lattice lower length 74 is between approximately 31 and 39 inches. In certain embodiments, the lattice lower length 74 is approximately 35⁵⁄₁₆ inches.

In some embodiments, the rib height 76 is between approximately 1 and 9 inches. In various embodiments, the rib height 76 is between approximately 3 and 7 inches. In certain embodiments, the rib height 76 is approximately 5⅜ inches. In some embodiments, the lattice height 78 is between approximately 1 and 5 inches. In various embodiments, the lattice height 78 is between approximately 2 and 4 inches. In certain embodiments, the lattice height 78 is approximately 3⅜ inches.

In some embodiments, the face thickness 80 is between approximately ⅛ and 2 inches. In various embodiments, the face thickness 80 is between approximately ¼ and 1 inches. In certain embodiments, the face thickness 80 is approximately ⅜ inches. In some embodiments, the rib thickness 82 is between approximately ¹⁄₁₆ and 1 inches. In various embodiments, the rib thickness 82 is between approximately ⅛ and ½ inches. In certain embodiments, the rib thickness 82 is approximately ¼ inches.

Now referring to FIG. 7C, a side elevation view of the lid 4 and various exemplary dimensions thereof are provided. In some embodiments, the lattice upper width 84 is between approximately 16 and 32 inches. In various embodiments, the lattice upper width 84 is between approximately 20 and 28 inches. In certain embodiments, the lattice upper width 84 is approximately 24 inches. In some embodiments, the lattice lower width 86 is between approximately 16 and 32 inches. In various embodiments, the lattice lower width 86 is between approximately 20 and 28 inches. In certain embodiments, the lattice lower width 86 is approximately 23¹¹⁄₁₆ inches.

Figure 8A:
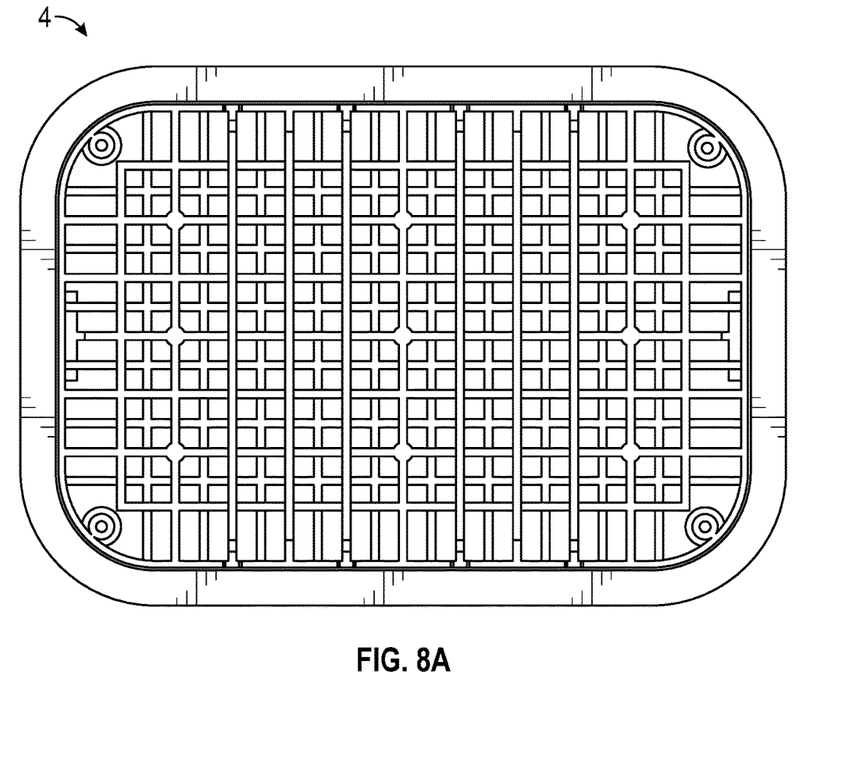
FIG. 8A is a bottom plan view of a lid having a protrusion of an interlock feature in accordance with various embodiments of the present invention.
Figure 8B:
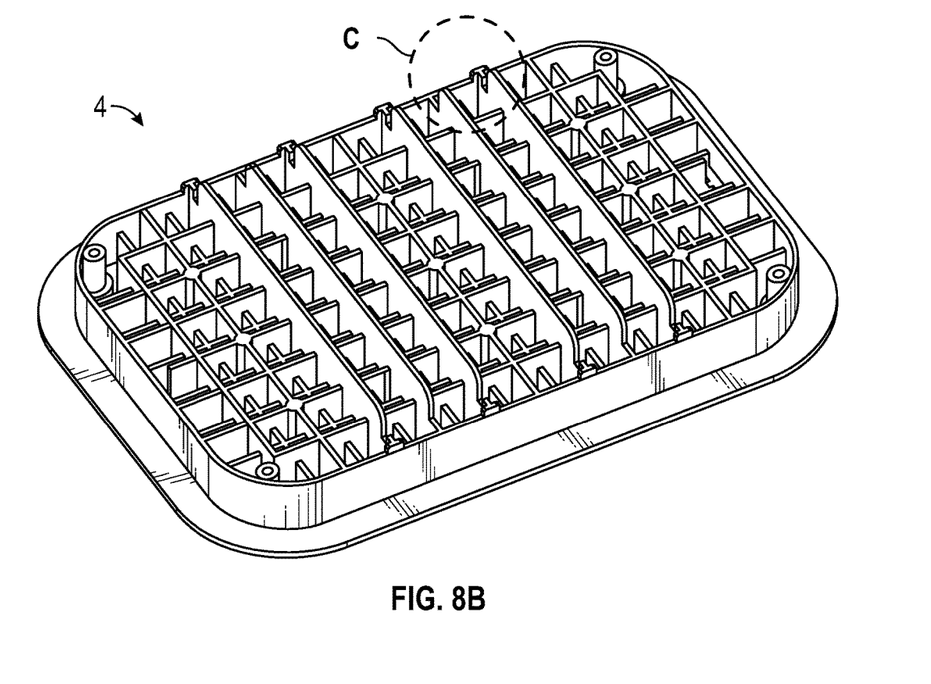
FIG. 8B is a bottom perspective view of a lid having a protrusion of an interlock feature in accordance with various embodiments of the present invention.
Figure 8C:
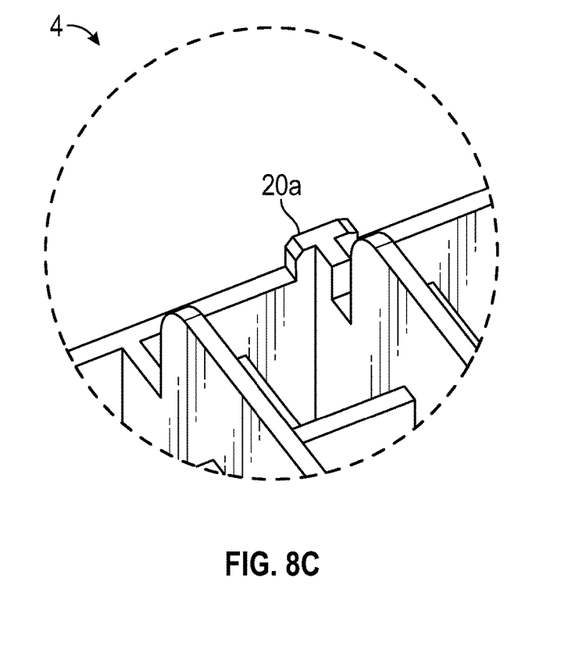
FIG. 8C is a detailed, exploded view of area "C" in FIG. 8B that details the protrusion that corresponds to channels described herein, in accordance with various embodiments of the present invention.

Now referring to FIGS. 8A-8C, various views of the lid 4 are provided. FIG. 8A is a bottom plan view of the lid 4. FIG. 8B is a perspective view of the lid 4 with an area "C". FIG. 8C is a detailed view of area "C" showing the first interlock feature 20*a*.

The description of the present invention has been presented for purposes of illustration and description, but is not intended to be exhaustive or limiting of the invention to the form disclosed. Many modifications and variations will be apparent to those of ordinary skill in the art. The embodiments described and shown in the figures were chosen and described in order to best explain the principles of the invention, the practical application, and to enable those of ordinary skill in the art to understand the invention.

While various embodiments of the present invention have been described in detail, it is apparent that modifications and alterations of those embodiments will occur to those skilled in the art. Moreover, references made herein to "the present invention" or aspects thereof should be understood to mean certain embodiments of the present invention and should not necessarily be construed as limiting all embodiments to a particular description. It is to be expressly understood that such modifications and alterations are within the scope and spirit of the present invention, as set forth in the following claims.

What is claimed is:

1. A utility vault with an interlocking vault and lid, comprising:
   a vault having a plurality of side walls with an upper end that defines an opening, said vault having a seat positioned proximate to said upper end;
   a first interlock feature positioned within said seat of said vault, said first interlock feature having a fastener channel and an orientation channel that intersects said fastener channel;
   a lid configured to selectively interconnect to said seat of said vault to close said opening defined by said upper end of said plurality of side walls; and
   a second interlock feature positioned on said lid, wherein said second interlock feature operably engages said first interlock feature when said lid is selectively interconnected to said seat of said vault, wherein said engaged interlock features maintain a relative position between said vault and lid.

2. The utility vault of claim 1, wherein said seat of said vault is positioned a predetermined distance from said upper end of said plurality of side walls to promote a ledge for supporting a lower portion of said lid.

3. The utility vault of claim 1, wherein a fastener axis is oriented between a center of said vault and a center of said fastener channel, and a longitudinal axis of said fastener channel forms a fastener angle with said fastener axis, said fastener angle is between approximately 60 degrees and 120 degrees.

4. The utility vault of claim 1, wherein said second interlock feature comprises a protrusion that extends into said fastener channel of said first interlock feature to operably engage said interlock features.

5. The utility vault of claim 1, wherein at least a portion of said orientation channel extends from said fastener channel to an inner surface of said vault.

6. The utility vault of claim 5, wherein a longitudinal axis of said orientation channel intersects a center of said vault.

7. The utility vault of claim 1, wherein said first interlock feature comprises a circular recess, and said second interlock feature comprises a protrusion that extends into said circular recess in said first interlock feature to operably engage said interlock features and to maintain the relative position between said lid and said vault.

8. The utility vault of claim 1, further comprising:
   a third interlock feature positioned within said seat of said vault; and
   a fourth interlock feature positioned on said lid, wherein said fourth interlock feature operably engages with said third interlock feature when said lid is selectively interconnected to said seat of said vault.

9. The utility vault of claim 8, wherein a longitudinal axis of said fastener channel does not intersect a center of said vault.

10. The utility vault of claim 1, further comprising:
an aperture positioned in said lid; and
a locking element for selectively interconnecting said lid to said seat of said vault, said locking element sized for positioning within said aperture in said lid.

11. The utility vault of claim 1, further comprising:
a plurality of first interlock features positioned within said seat of said vault; and
a plurality of second interlock features positioned on said lid, wherein said plurality of second interlock features operably engages said plurality of first interlock features when said lid is selectively interconnected to said seat of said vault.

12. The utility vault of claim 1, wherein a longitudinal dimension of said fastener channel is larger than a lateral dimension of said fastener channel.

13. The utility vault of claim 1, wherein a longitudinal dimension of said orientation channel is larger than a lateral dimension of said orientation channel.

14. The utility vault of claim 1, wherein a longitudinal dimension of said fastener channel is orientated substantially perpendicular to a longitudinal dimension of said orientation channel.

15. A subgrade utility vault defining an enclosed volume, comprising:
a plurality of side walls having an upper end that defines an opening;
a shoulder positioned on an inner surface of said plurality of side walls, wherein an area defined by an inner perimeter of said shoulder is less than an area defined by said opening;
a plurality of first interlock features positioned within said shoulder, each first interlock feature comprises a fastener channel and an orientation channel that are oriented substantially perpendicular to each other;
wherein a fastener axis is oriented between a center of said vault and a center of said fastener channel, and a longitudinal axis of said fastener channel forms a fastener angle with said fastener axis, said fastener angle is between approximately 60 degrees and 120 degrees;
wherein an orientation axis is oriented between said center of said vault and a center of said orientation channel, and a longitudinal axis of said orientation channel forms an orientation angle with said orientation axis, said orientation angle is between approximately −30 degrees and 30 degrees; and
wherein said fastener channel and said orientation channel of each first interlock feature are configured to receive a protrusion from a second interlock feature of a lid.

16. The subgrade utility vault of claim 15, wherein at least one of said first interlock features and comprises an aperture than is configured to receive a locking mechanism that passes through an aperture of said corresponding second interlock feature of said lid.

17. The subgrade utility vault of claim 15, further comprising:
a third interlock feature positioned within said shoulder, said third interlock feature having a fastener channel, wherein a third axis is oriented between said center of said vault and a center of said fastener channel of said third interlock feature, and a longitudinal axis of said fastener channel of said third interlock feature forms a third angle with said third axis, said third angle is between approximately 60 degrees and 120 degrees, wherein said third angle of said third interlock feature is distinct from said fastener angle of said first interlock features.

18. A utility vault with an interlocking vault and lid, comprising:
a vault having a plurality of side walls with an upper end that defines an opening, said vault having a seat positioned proximate to said upper end;
a first interlock feature positioned within said seat of said vault, said first interlock feature having a fastener channel, wherein a fastener axis is oriented between a center of said vault and a center of said fastener channel, and a longitudinal axis of said fastener channel forms a fastener angle with said fastener axis, said fastener angle is between approximately 60 degrees and 120 degrees;
a lid configured to selectively interconnect to said seat of said vault to close said opening defined by said upper end of said plurality of side walls; and
a second interlock feature positioned on said lid, wherein said second interlock feature operably engages said first interlock feature when said lid is selectively interconnected to said seat of said vault, wherein said engaged interlock features maintain a relative position between said vault and lid.

19. The utility vault of claim 18, wherein said second interlock feature comprises a protrusion that extends into said fastener channel of said first interlock feature to operably engage said interlock features.

20. The utility vault of claim 18, wherein said first interlock feature comprises an orientation channel that extends to an inner surface of said vault, and wherein said orientation channel is oriented substantially perpendicular to said fastener channel.

* * * * *